(12) United States Patent
Suzuki

(10) Patent No.: US 8,471,145 B2
(45) Date of Patent: Jun. 25, 2013

(54) TERMINAL BOX AND SOLAR CELL MODULE

(75) Inventor: Issei Suzuki, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 295 days.

(21) Appl. No.: 12/995,033

(22) PCT Filed: Jul. 14, 2008

(86) PCT No.: PCT/JP2008/062720
§ 371 (c)(1),
(2), (4) Date: Nov. 29, 2010

(87) PCT Pub. No.: WO2010/007659
PCT Pub. Date: Jan. 21, 2010

(65) Prior Publication Data
US 2011/0073157 A1 Mar. 31, 2011

(51) Int. Cl.
*H01B 17/00* (2006.01)
*B65D 88/40* (2006.01)

(52) U.S. Cl.
USPC .............. 174/50; 174/66; 174/67; 174/57; 174/58; 174/520; 220/241; 220/242; 220/3.2; 220/4.02

(58) Field of Classification Search
USPC .. 174/50–60, 66, 67, 520, 539, 560; 439/535; 249/906; 220/4.02, 214, 242, 3.2–3.9, 241; 136/244
See application file for complete search history.

(56) References Cited

U.S. PATENT DOCUMENTS

| 4,460,232 | A | * | 7/1984 | Sotolongo | 439/535 |
| 4,850,081 | A | * | 7/1989 | Grant | 16/257 |
| 6,307,144 | B1 | * | 10/2001 | Mimura et al. | 136/244 |
| 6,462,265 | B1 | | 10/2002 | Sasaoka et al. | |
| 6,727,429 | B1 | * | 4/2004 | Koessler | 174/50 |
| 2006/0196534 | A1 | * | 9/2006 | Takada et al. | 136/244 |

FOREIGN PATENT DOCUMENTS

JP     62-002017 A     1/1987
(Continued)

OTHER PUBLICATIONS

International Search Report (PCT/ISA/210) issued on Oct. 14, 2008, by Japanese Patent Office as the International Searching Authority for International Application No. PCT/JP2008/062720.

(Continued)

*Primary Examiner* — Jayprakash N Gandhi
*Assistant Examiner* — Ahmad D Barnes
(74) *Attorney, Agent, or Firm* — Buchanan Ingersoll & Rooney PC

(57) ABSTRACT

A terminal box has a box body that has a shape of a box having an opening on one surface, has a body-side hinge structure on an end thereof, and accommodates therein an output-cable connecting unit, and a cover that has a cover-side hinge structure forming a hinge structure with the body-side hinge structure, that is pivotally supported by the hinge structure an end thereof so as to pivotally open or close the opening of the box body. The hinge structure has an attitude holding structure that holds an attitude of the cover at a position where the cover is at a predetermined angle with respect to the box body.

8 Claims, 14 Drawing Sheets

FOREIGN PATENT DOCUMENTS

| | | |
|---|---|---|
| JP | 64-059992 A | 3/1989 |
| JP | 6-058231 U | 8/1994 |
| JP | 9-186470 A | 7/1997 |
| JP | 10-116392 A | 5/1998 |
| JP | 2000-248817 A | 9/2000 |
| JP | 2000-252644 A | 9/2000 |
| JP | 2002-009326 A | 1/2002 |

OTHER PUBLICATIONS

Written Opinion (PCT/ISA/237) issued on Oct. 14, 2008, by Japanese Patent Office as the International Searching Authority for International Application No. PCT/JP2008/062720.

Office Action issued on Oct. 2, 2012 by the Japanese Patent Office in corresponding Japanese Application No. 2010-520698, and an English translation thereof.

* cited by examiner

TERMINAL BOX AND SOLAR CELL MODULE

TECHNICAL FIELD

The present invention relates to a terminal box that is installed on a rear surface of a solar cell module and outputs power generated by the solar cell module, and, more particularly to a terminal box that requires a cable connecting operation at a predetermined installation location where the solar cell module is installed. The present invention also relates to a solar cell module that includes the terminal box.

BACKGROUND ART

A terminal box for a solar cell module generally includes a box body in the shape of a square case and a cover, and accommodates therein electrical components and cable connecting devices. The cover for closing an opening of the box body is fit to the opening of the box body and then screwed, for example, at four corners to be fixed to the box body. When a cable connecting operation is to be performed, fastening screws at the four corners are removed and then the cover is detached from the box body to enable the connecting operation.

A solar cell module is normally installed at a high location, and the location is sometimes inclined and therefore not a good place for operations. This may cause the cover detached from the box body to be lost during the operations, and improvements for this have been sought. Because the terminal box is installed on the rear surface of the solar cell module, the operator needs to perform the cable connecting operation lying under the solar cell module on his/her back. This operation is not easy and therefore requires to be improved.

For this improvement, it is conventionally proposed that one end of a cover is pivotally supported by a box body so that the cover is pivotally opened or closed. According to this proposed technique, the cover is connected to the box body even when the cover is in an opened state, which prevents the cover from being lost. Because the end of the cover is pivotally supported, the number of positions to be screwed is reduced to half and workability is enhanced (see, for example, Patent Document 1).

Patent Document 1: Japanese Patent Application Laid-open No. H09-186470

DISCLOSURE OF INVENTION

Problem to be Solved by the Invention

However, because the terminal box is installed on the rear surface of the solar cell module, the operator needs to perform the cable connecting operation lying under the solar cell module on his/her back as described above. At that time, the cover having one end pivotally supported as in the proposed technique hangs down vertically due to its own weight, which becomes an obstacle to the operation and lowers the workability.

The present invention has been achieved in view of the above circumstances, and an object of the present invention is to provide a terminal box that has a cover not hanging down, for example, not becoming an obstacle to a cable connecting operation and that can enhance workability, and a solar cell module that includes the terminal box.

Means for Solving Problem

A terminal box according to an aspect of the present invention is installed on a rear surface of a solar cell module and outputs power generated by the solar cell module, including: a box body that has a shape of a box having an opening on one surface, has a body-side hinge structure on an end thereof, and accommodates therein an output-cable connecting unit; and a cover that has a cover-side hinge structure forming a hinge structure with the body-side hinge structure, and that is pivotally supported by the hinge structure on an end thereof so as to pivotally open or close the opening of the box body, wherein the hinge structure has an attitude holding structure that holds an attitude of the cover at a position where the cover is within a predetermined angular range with respect to the box body.

Furthermore, a solar cell module according to another aspect of the present invention has a terminal box for outputting generated power on a rear surface thereof, wherein the terminal box includes: a box body that has a shape of a box having an opening on one surface, has a body-side hinge structure on an end thereof, and accommodates therein an output-cable connecting unit; and a cover that has a cover-side hinge structure forming a hinge structure with the body-side hinge structure, and that is pivotally supported by the hinge structure on an end thereof so as to pivotally open or close the opening of the box body, and the hinge structure has an attitude holding structure that holds an attitude of the cover at a position where the cover is within a predetermined angular range with respect to the box body.

Effect of the Invention

According to the present invention, an attitude of the cover can be held at a predetermined angle. Therefore, the cover does not hang down from the box body and does not become an obstacle to an operation during a cable connecting operation, for example, which enhances workability.

EXPLANATIONS OF LETTERS OR NUMERALS

Figure 1:
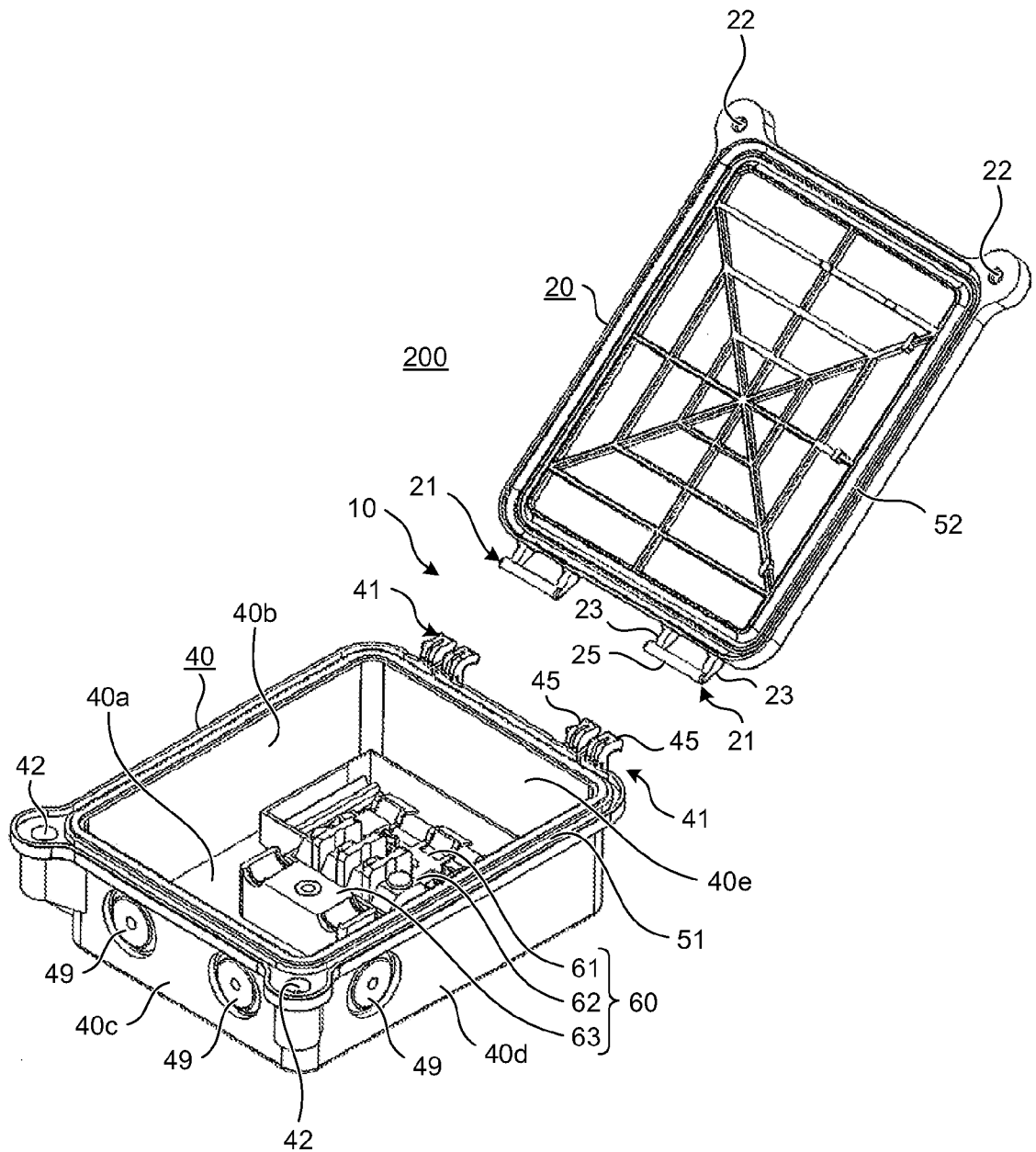
FIG. 1 is a perspective view of a terminal box for a solar cell module according to an embodiment of the present invention.

10 Hinge structure
20 Cover
21 Cover-side hinge structure
22 Fastening hole
23 Hinge axis leg
25 Hinge axis
25a Chipped portion
27 Runout concave portion
40 Box body
40a Bottom plate
40b, 40c, 40d, 40e Side plate
41 Body-side hinge structure
42 Fastening hole
45 C-shaped bearing (bearing)
45A Upper pawl (first pawl)
45B Lower pawl (second pawl)
48 Convex portion
49 Knockout portion
51 Packing
52 Fitting channel
60 Electrical device
61 Electrical circuit unit
62 Terminal block (output-cable connecting unit)
63 Cable base (output-cable connecting unit)
71A Positive output cable
71B Negative output cable
72 Plastic pipe
91 Solar cell layer
94 Rear cover member
95 Solar panel
96 Support frame
200 Terminal box
300 Solar cell module
301 Mount

BEST MODE(S) FOR CARRYING OUT THE INVENTION

Exemplary embodiments of a terminal box for a solar cell module according to the present invention will be explained below in detail with reference to the accompanying drawings. The present invention is not limited to the embodiments.

Embodiment

FIG. 1 is a perspective view of a terminal box for a solar cell module according to an embodiment of the present invention. A terminal box 200 includes a box body 40 approximately in the shape of a rectangular solid box that includes one surface fully opened, and a cover 20 approximately in the shape of a flat plate that closes the opening of the box body 40. Two pairs of hinge structures 10 that pivotally connect the box body 40 and the cover 20 are provided therebetween.

The box body 40 forms the shape of a rectangular solid box having a bottom plate 40a, and side plates 40b, 40c, 40d, and 40e that enclose four sides thereof, and interiorly accommodates an electrical device 60 on the bottom plate 40a. The electrical device 60 includes an electrical circuit unit 61 that includes electrical components (not shown) such as a bypass diode and a terminal board, to which a lead extending from a solar panel is connected; a terminal block (an output-cable connecting unit) 62 that connects the electrical circuit unit 61 to an output cable (explained later); and a cable base (an output-cable connecting unit) 63 to which a cable inserted from outside is fixed. The terminal box 200 is made of PPE (polyphenylene ether). The PPE is resin having high functionality with excellent heat resistance, flame resistance, dimension stability, mechanical characteristics, and the like. A potting material is filled between the electrical components of the electrical circuit unit 61 among the electrical device 60, like in the conventional technique. The electrical circuit unit 61 filled with the potting material is covered with an internal cover (not shown) like in the conventional technique.

Packing 51 is provided around an entire periphery of the opening of the box body 40. Body-side hinge structures 41 that constitute a half of the hinge structures 10 are formed on one of short sides of the opening periphery. Two body-side hinge structures 41 are provided so as to correspond to the hinge structure 10. Fastening holes 42 are formed at both end corners of the other short side of the opening periphery. Knockout portions 49 are formed on the side plates of the box body 40 to be broken and become cable holes. One knockout portion 49 is formed on each of the side plates 40b and 40d, and two knockout portions 49 are formed on the side plate 40c.

A fitting channel 52 that fits the packing 51 is formed around a periphery of the cover 20. The cover 20 is fitted to the opening of the box body 40 by means of the fitting channel 52. Cover-side hinge structures 21 that form the other half of the hinge structures 10 are formed on a short side of the cover 20 near to the box body 40. Fastening holes 22 are formed at both end corners on the other short side of the cover 20.

As described above, the hinge structure 10 includes the cover-side hinge structure 21 provided to the cover 20 and the body-side hinge structure 41 provided on the box body 40. The cover 20 has one end pivotally supported by the hinge structure 10 to be made pivotable. That is, the cover 20 pivotally opens or closes the opening of the box body 40 with the end pivotally supported by the hinge structures 10 provided between the cover 20 and the box body 40. When the cover 20 is to be fixed in a closed state, it is fastened by fastening screws (not shown) passing through the fastening holes 22 and 42.

Figure 2:
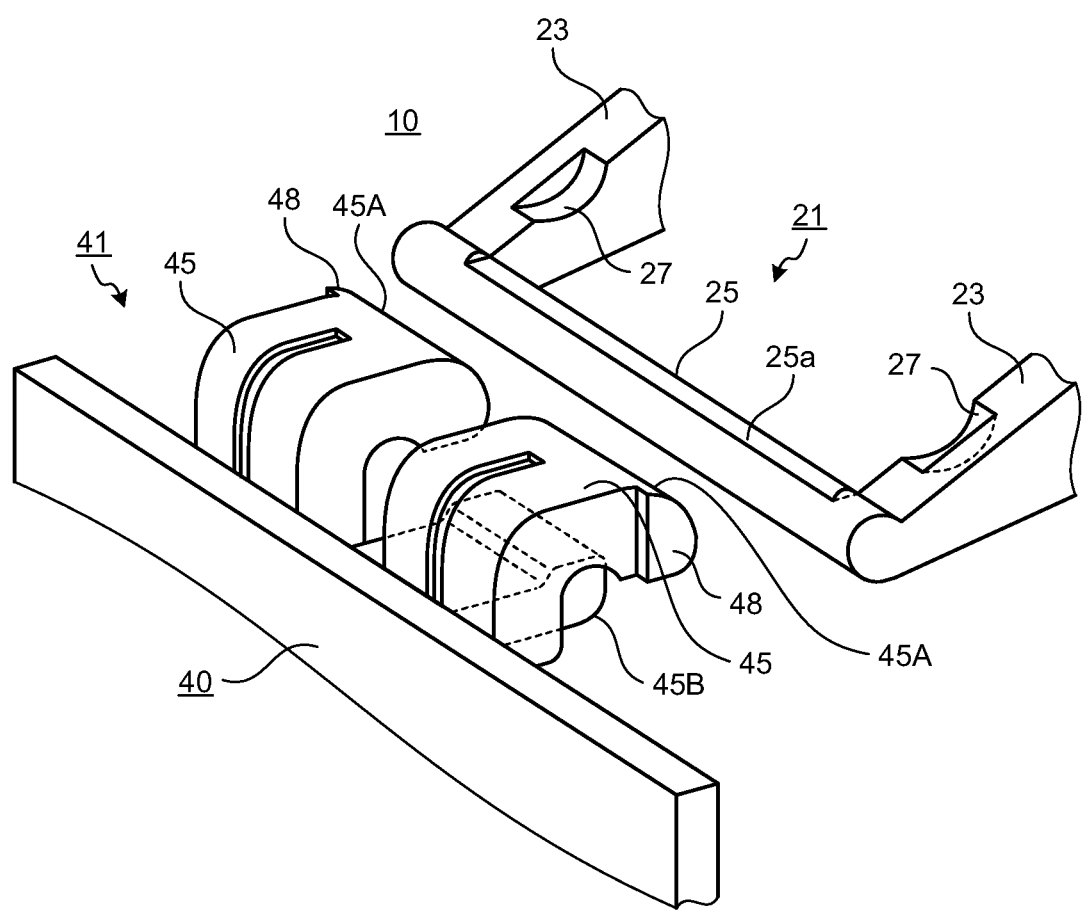
FIG. 2 is a partial enlarged perspective view depicting a portion of a hinge structure of the terminal box.

FIG. 2 is a partial enlarged perspective view depicting a portion of the hinge structure of the terminal box 200. In explanation of the terminal box 200, the side where the cover 20 is located with respect to the box body 40 is treated as an upper side; however, it should be noted that the cover 20 is practically located on a lower side when the terminal box 200 is installed by being attached to a solar cell module as described later. As shown in FIG. 2, the cover-side hinge structure 21 includes a hinge axis 25 placed in parallel to the short side of the cover 20 with a predetermined distance spaced from the short side, and hinge axis legs 23 that are projected from the short side of the cover 20 to support both ends of the hinge axis 25. Chipped portions 25a (explained later) are formed on an outer circumferential side surface of the hinge axis 25.

The body-side hinge structure 41 includes a pair of C-shaped bearings (bearings) 45 that are formed to project from an edge of the opening of the box body 40 toward outside. The pair of C-shaped bearings 45 includes a pair of upper pawls (first pawls) 45A that are formed with a predetermined distance spaced therebetween to curve from the upper side toward a front side, and a lower pawl (a second pawl) 45B that is formed to be sandwiched between the two upper pawls 45A and project from below. The body-side hinge structure 41 grips the hinge axis 25 between the upper pawls 45A and the lower pawl 45B to pivotally support the cover-side hinge structure 21.

Figure 3:
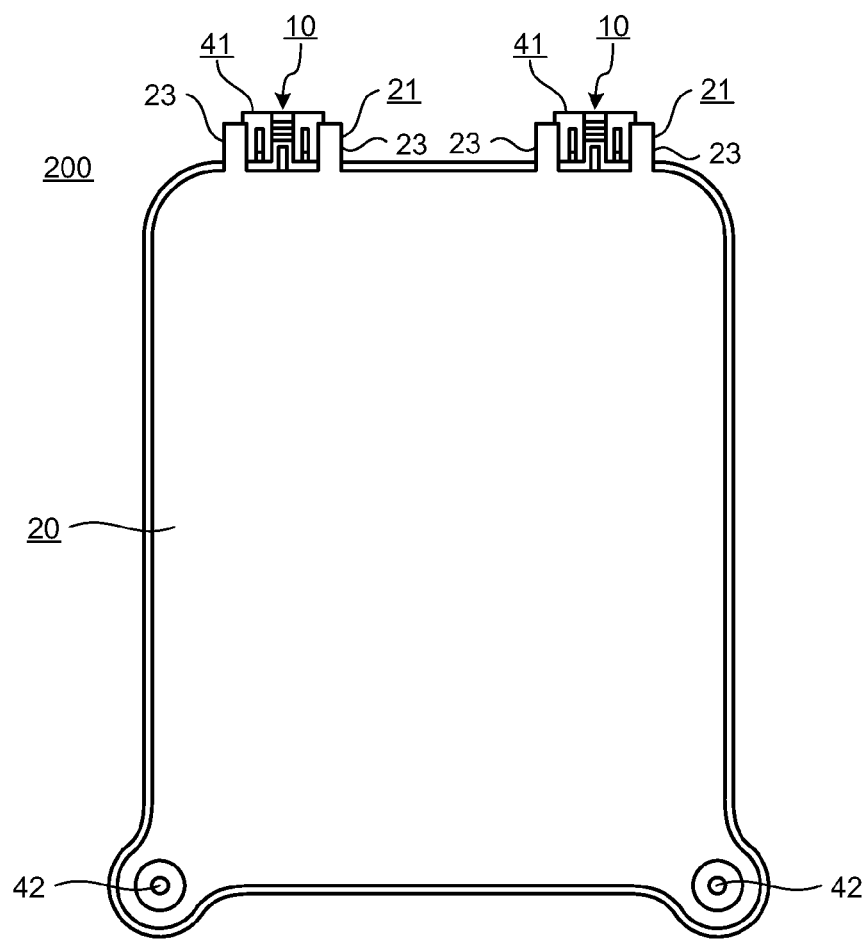
FIG. 3 is a top view of the terminal box with a cover closed.
Figure 4:
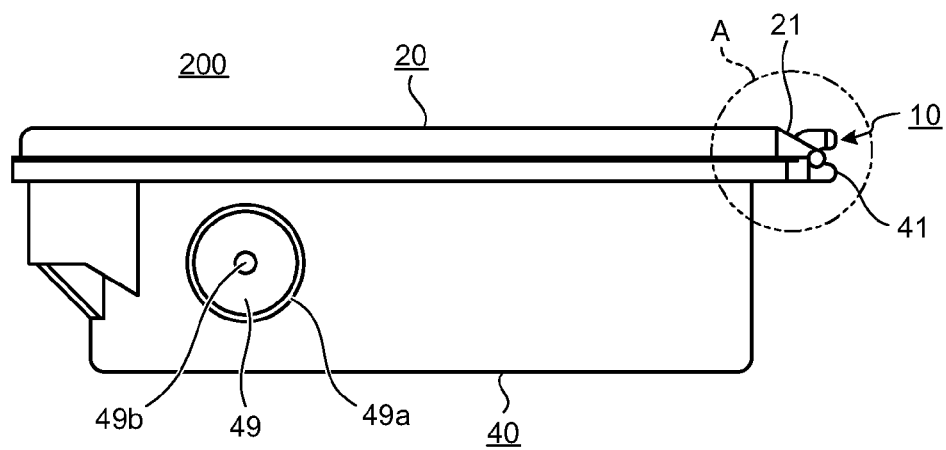
FIG. 4 is a side view of the terminal box with the cover closed.

FIG. 3 is a top view of the terminal box with the cover closed. FIG. 4 is a side view of the terminal box with the cover closed similarly. As described above, the knockout portions 49 are formed on the side plates of the box body 40 to be broken and become the cable holes. The knockout portion 49 is formed by molding a part of the side plate into a thin-walled circle so as to be surrounded by an annular slot. A circular plate within the annular slot is easily removed (knocked out) by means of a cutting tool, a screwdriver, or the like, thereby easily forming a cable hole (a circular hole).

The knockout portion 49 has a minus slot 49b formed in a center thereof and a plus slot (an annular slot) 49a formed therearound, so that a tip of a cross slot screwdriver or a straight slot screwdriver as a rod-like knockout tool can be inserted therein, respectively. When the tip of the screwdriver is inserted into the plus slot 49a or the minus slot 49b and then the screwdriver is knocked with a hammer, the knockout portion 49 is annually broken to remove the circular plate, thereby forming the cable hole.

Figure 5:
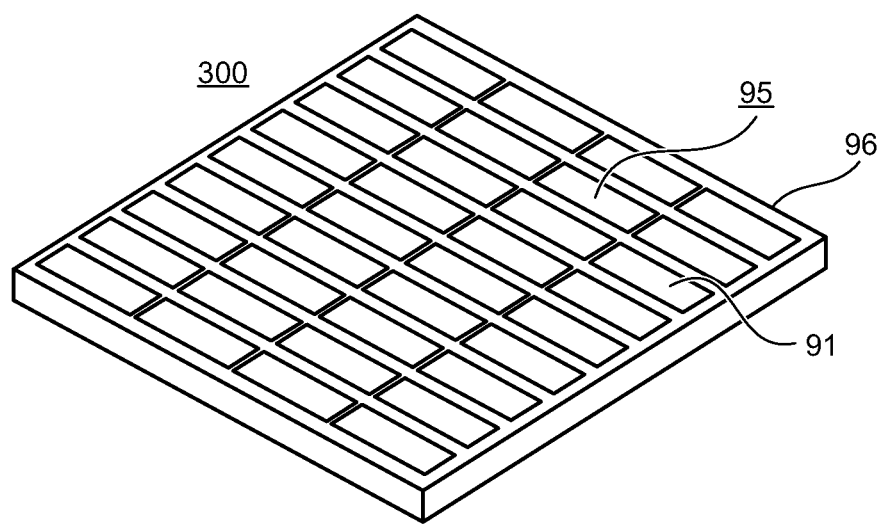
FIG. 5 is a perspective view of a solar cell module seen from a front side.
Figure 6:
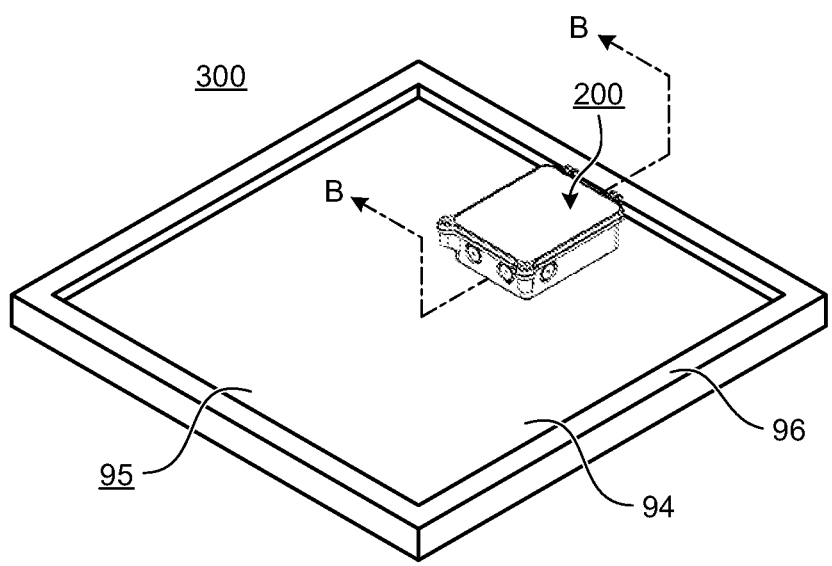
FIG. 6 is a perspective view of the solar cell module seen from a rear side.

FIG. 5 is a perspective view of a solar cell module seen from a front side. FIG. 6 is a perspective view of the solar cell module seen from a rear side. A solar cell module 300 includes a solar panel 95, an aluminum support frame 96 that covers and protects an outer periphery of the solar panel 95, and the terminal box 200 attached to a rear surface (a rear cover member 94) of the solar panel 95. The solar panel 95 has a laminate structure that is obtained by laminating a solar cell layer 91, which is obtained by series-connecting and resin-sealing many solar cells arranged in order; a front cover member (not shown) that has high translucency and covers a front surface of the solar cell layer 91; and the rear cover member 94 that has high weatherability and covers the rear surface of the solar cell layer 91.

The terminal box 200 is installed on the rear surface of the solar cell module 300 at a center of a position near to one side. The rear surface of the terminal box 200 is attached and fixed to the solar panel 95 with the hinge structure 10 facing outward. At the time of shipping of the solar cell module 300, the electrical device 60 installed therein, and the electrical circuit unit 61 is filled with the potting material. The solar cell module 300 is closed with an inner cover (not shown), the cover 20 is closed and fastened, and none of the knockout portions 49 is punched out (broken).

Figure 7:
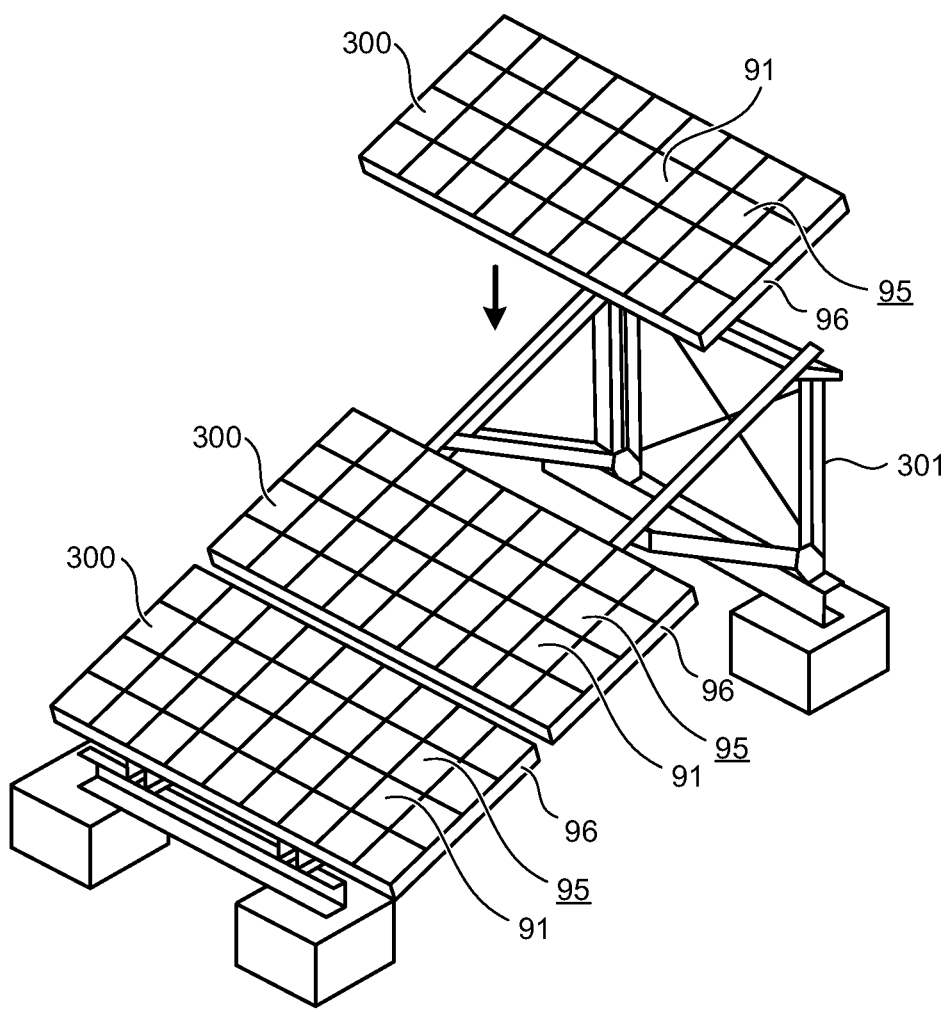
FIG. 7 is a perspective view of the solar cell module installed on a structure.

FIG. 7 is a perspective view of the solar cell module 300 installed on a structure. Normally, a plurality of the solar cell modules 300 is installed next to each other on a dedicated mount 301 provided on a roof or the like of the structure. The solar cell module 300 is normally installed with surfaces of the solar cell 91 layer being upward (toward the sky) and the surface attached with the terminal box 200 being downward (toward the ground). A terminal box (not shown) is attached on the rear surface of the solar cell module 300. This indicates that the terminal box 200 is installed with the cover 20 facing downward (toward the ground).

Figure 8:
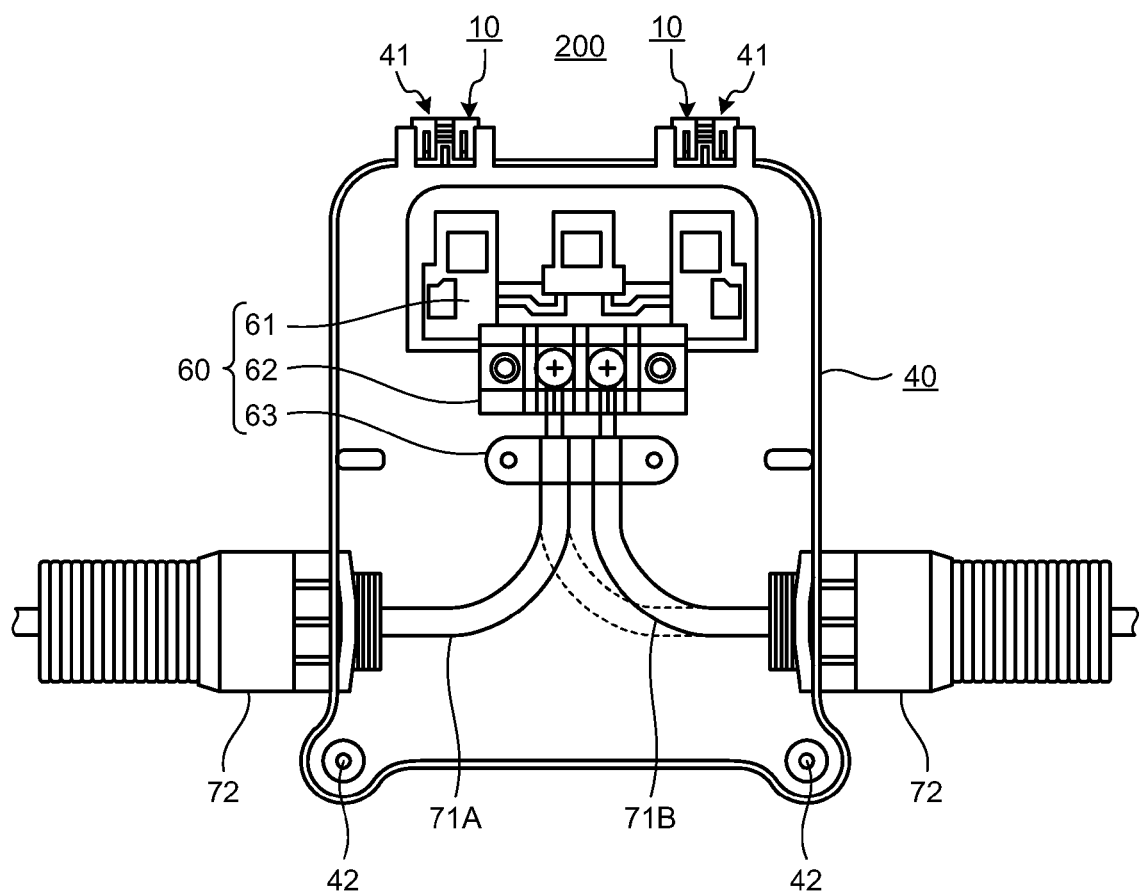
FIG. 8 is a top view of a state where cables are connected to the terminal box.

FIG. 8 is a top view of the terminal box to which cables are connected. FIG. 8 depicts a state where the terminal box is seen through the cover 20 so that the configuration related to the cable connection can be recognized well. To output power from the solar cell modules 300 that are installed next to each other, it is necessary to open the cover 20 of the terminal box 200 and lay cables inside the terminal box 200. The terminal box 200 according to the present embodiment is a terminal box that requires post-laying of cables 71A and 71B at the installation location after the solar cell module 300 is installed. The positive output cable 71A and the negative output cable 71B are laid from the cable holes, which are formed by knocking out the knockout portions 49, into the box body 40 through plastic pipes 72 and fixed to the cable base 63, and ends of the cables are connected to the electrical circuit unit 61 on the terminal block 62. The terminal box 200 is then closed with the inner cover (not shown), and then the cover 20 is closed and fixed with the fastening screws. The other ends of the positive output cable 71A and the negative output cable 71B can be connected to another solar cell module or a storage battery. While the plural knockout portions 49 are formed on the side opposite to the hinge structure 10, any two of the knockout portions 49 are broken to form the cable holes depending on cable layout. In the example shown in FIG. 8, the knockout portions formed on two side plates extending longitudinally are used as the cable holes.

Figure 9:
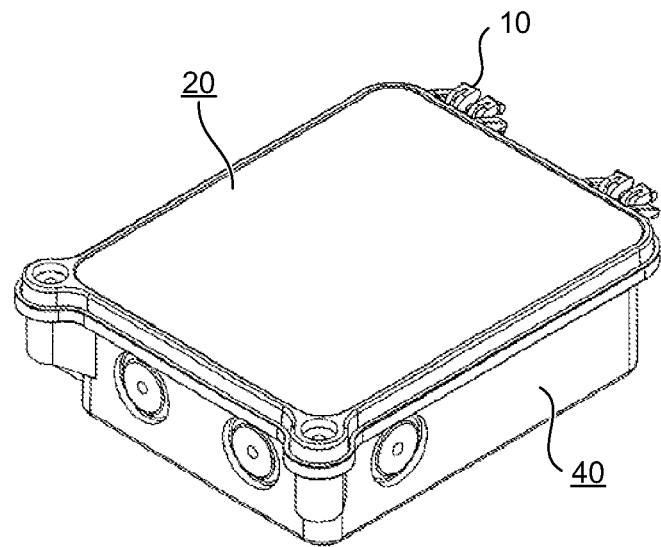
FIG. 9 is a perspective view of a terminal box with a cover closed.
Figure 10:
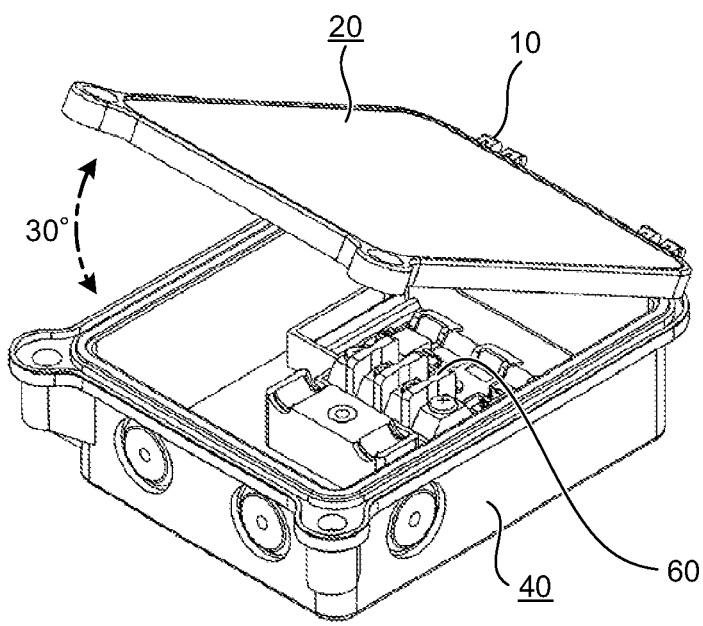
FIG. 10 is a perspective view of the terminal box with the cover opened at 30 degrees.
Figure 11:
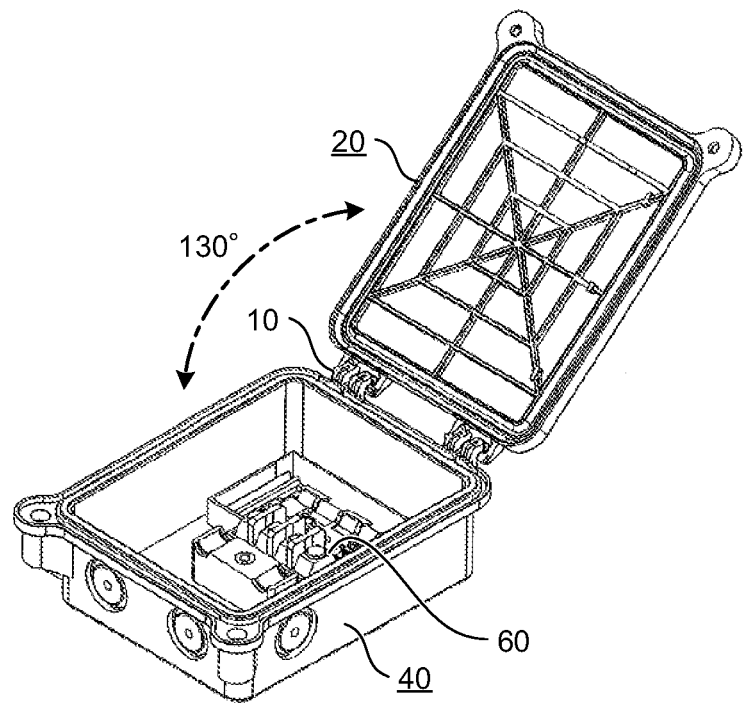
FIG. 11 is a perspective view of the terminal box with the cover opened at 130 degrees.
Figure 12:
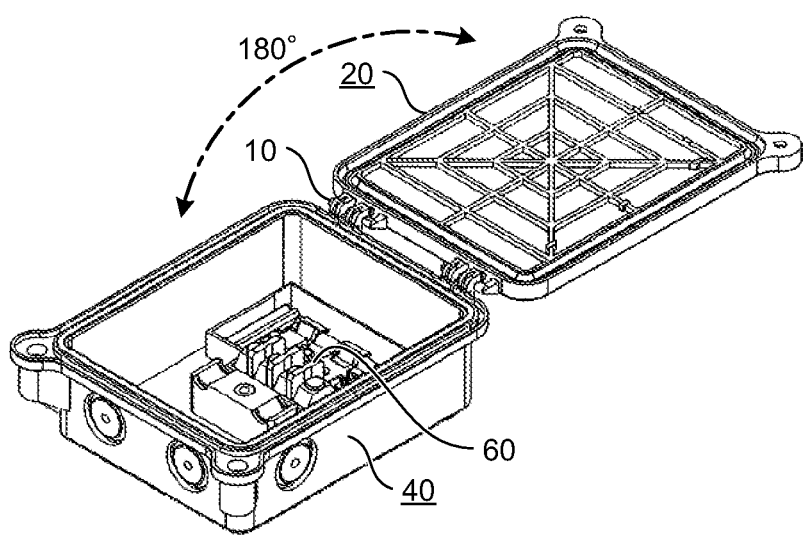
FIG. 12 is a perspective view of the terminal box with the cover opened at 180 degrees.

FIG. 9 is a perspective view of a terminal box with the cover 20 closed. FIG. 10 is a perspective view of the terminal box with the cover 20 opened at 30 degrees. FIG. 11 is a perspective view of the terminal box with the cover 20 opened at 130 degrees. FIG. 12 is a perspective view of the terminal box with the cover 20 opened at 180 degrees.

The terminal box according to the present embodiment has an attitude holding structure that holds an attitude of the cover 20 at a predetermined angle among the total angle of pivot of the cover 20. As shown in FIGS. 9 to 12, the cover 20 pivots from the closed state (0 degree) shown in FIG. 9 to the state opened at 180 degrees shown in FIG. 12, and the total angle of pivot is 180 degrees. The attitude of the cover 20 according to the present embodiment is held in the state opened approximately 130 degrees as shown in FIG. 11 within the total angle of pivot by the attitude holding structure provided to the hinge structure 10. An operation of this attitude holding is explained below.

Figure 13:
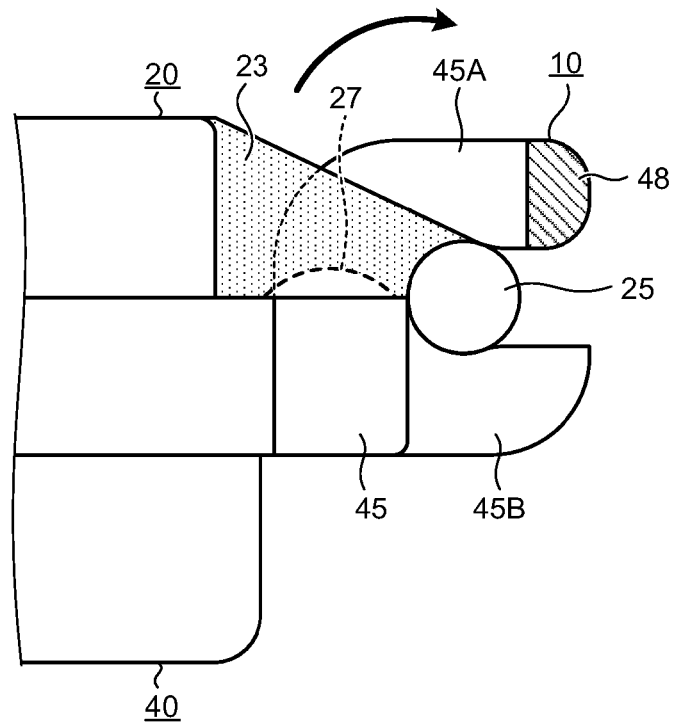
FIG. 13 is a partial side view of a hinge structure, depicting a state where the cover is closed.
Figure 14:
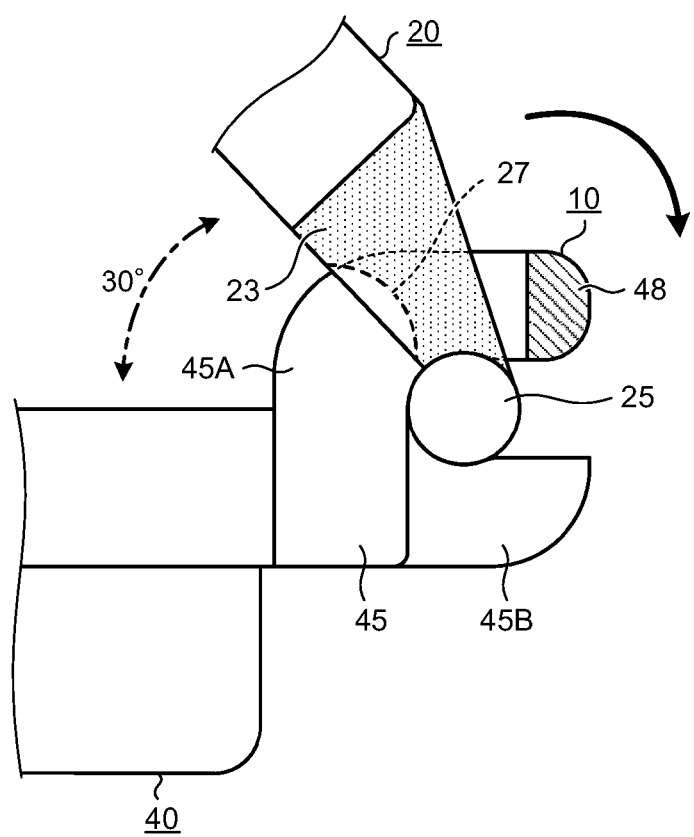
FIG. 14 is a partial side view of the hinge structure, depicting a state where the cover is opened at 30 degrees.
Figure 15:
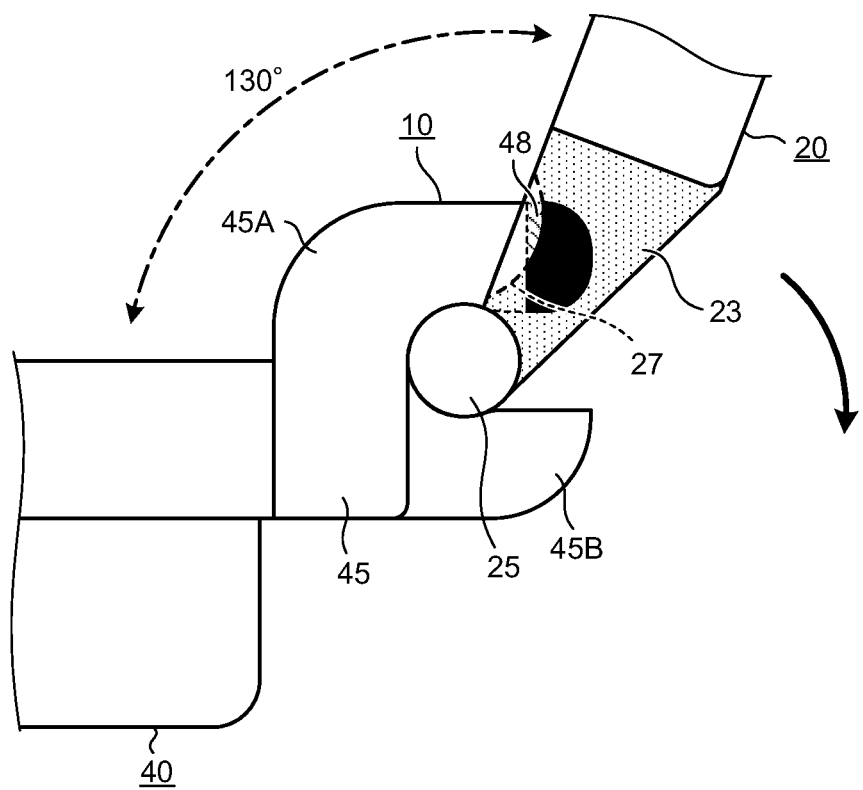
FIG. 15 is a partial side view of the hinge structure, depicting a state where the cover is opened at 130 degrees.
Figure 16:
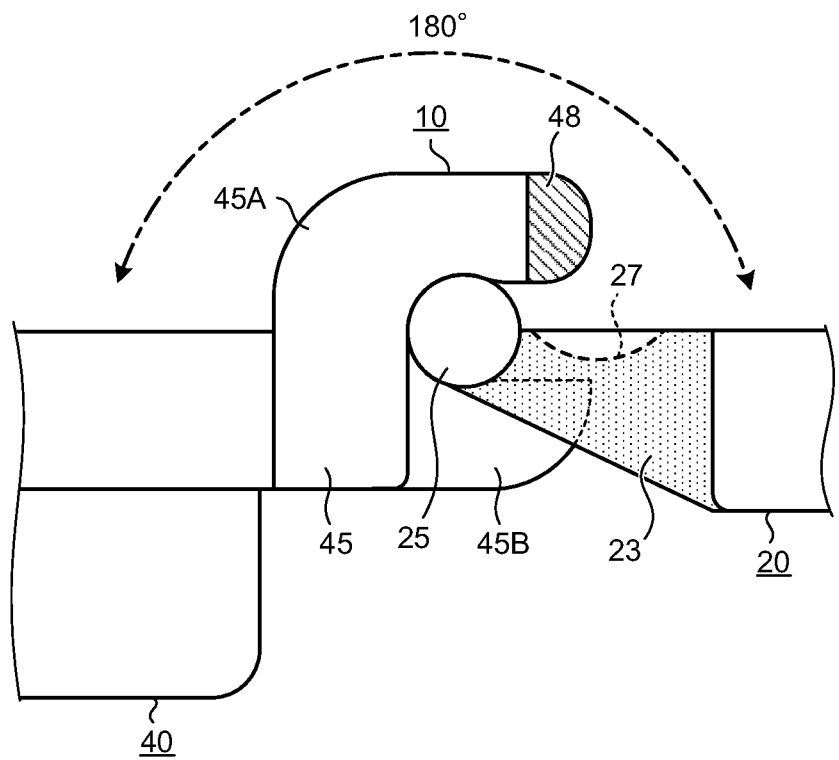
FIG. 16 is a partial side view of the hinge structure, depicting a state where the cover is opened at 180 degrees.
Figure 17:
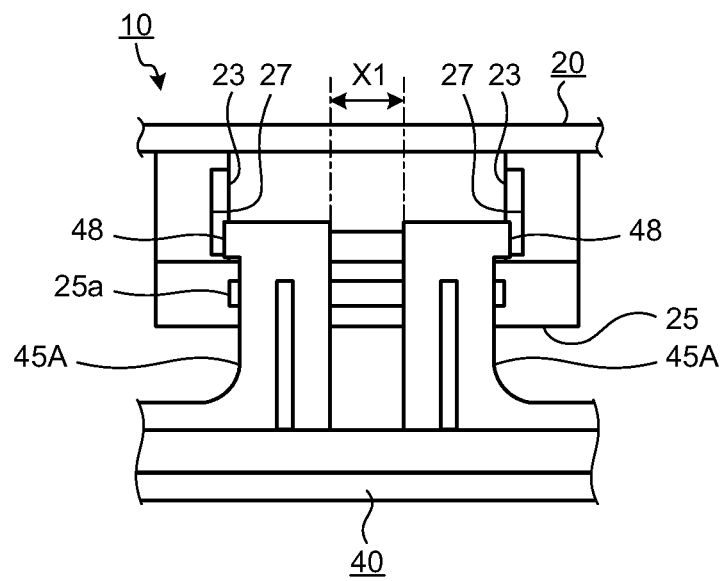
FIG. 17 is a partial top view explaining positions of a pair of C-shaped bearings, convex portions provided thereto, and hinge axis legs.
Figure 18:
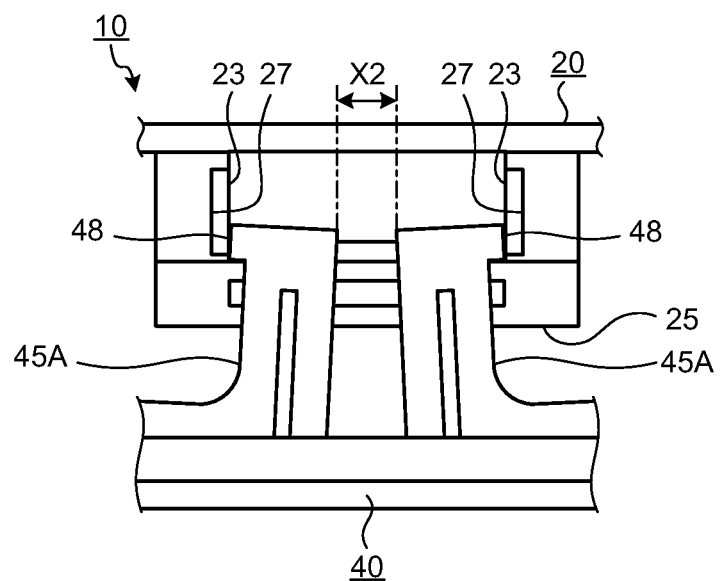
FIG. 18 is a partial top view depicting a state where the pair of C-shaped bearings is pressed from both sides and deformed to reduce a distance therebetween.

FIG. 13 is a partial side view of the hinge structure 10 corresponding to a portion A in FIG. 4, depicting a state where the cover 20 is closed. FIG. 14 is a partial side view of the hinge structure 10, depicting a state where the cover 20 is opened at 30 degrees. FIG. 15 is a partial side view of the hinge structure 10, depicting a state where the cover 20 is opened at 130 degrees. FIG. 16 is a partial side view of the hinge structure 10, depicting a state where the cover 20 is opened at 180 degrees. FIG. 17 is a partial top view for explaining positions of the pair of C-shaped bearings 45, convex portions 48 provided thereto, and the hinge axis legs 23. FIG. 18 is a partial top view depicting a state where the pair of C-shaped bearings 45 is pressed from both sides and deformed to reduce the distance therebetween.

An operation of the attitude holding structure is explained based on an operation of the cover 20 moving from the closed state shown in FIG. 13 to the state opened at 180 degrees shown in FIG. 16. It is assumed here that the terminal box 200 is placed horizontally with the cover 20 facing downward. As shown in FIGS. 17 and 18, the upper pawls 45A of the C-shaped bearings 45 and the hinge axis legs 23 are positioned close to each other in the hinge structure 10. Outer side surfaces of the upper pawls 45A and inner side surfaces of the hinge axis legs 23 (that is, the surfaces of the upper pawls 45A and the hinge axis legs 23 facing each other) are approximately on the same surface with leaving a small gap therebetween. As shown in FIGS. 13 to 18, the convex portions 48 that form a part of the attitude holding structure are provided on tips of the upper pawls 45A so as to project toward the hinge axis legs 23 that form the other part of the attitude holding structure. The convex portions 48 that are formed on a pair of the upper pawls 45A, respectively, project outward in the axial direction from the surface including the hinge axis legs 23 (see FIGS. 2 and 17). In FIGS. 13 to 16, the surface of the hinge axis leg 23 facing the upper pawl 45A (it is actually located on the rear side and cannot be seen) is gray hatched, a top surface of the convex portion 48 provided on the upper pawl 45A is hatched in lines, and a portion where both of these overlap with each other is blacked out (see FIG. 15).

From the state where the cover 20 is closed as shown in FIGS. 9 and 13 to the state where the cover 20 is opened at 30 degrees as shown in FIGS. 10 and 14, the cover 20 is pivoted by small force without resistance. When the cover 20 is further pivoted, end surfaces of the hinge axis legs 23 and tips of the convex portions 48 are brought into contact with each other.

When more force is applied to further pivot the cover 20 from the state where the end surfaces of the hinge axis legs 23 and the tips of the convex portions 48 are brought into contact with each other, inner surfaces of the hinge axis legs 23 press the convex portions 48. This force causes the two C-shaped bearings 45 (the upper pawls 45A) to bend toward inside, and the distance between the two C-shaped bearings 45 (the upper pawls 45A) is changed from X1 (FIG. 17) to X2 (FIG. 18). This causes the convex portions 48 to run on the inner surfaces of the hinge axis legs 23 (FIGS. 15 and 18). At that time, the C-shaped bearings 45 (the upper pawls 45A), which is elastically deformed, firmly press the inner surfaces of the hinge axis legs 23 with the top surfaces of the convex portions 48 by return force. Frictional resistance due to this pressing overcomes gravity force acting on the cover 20, and holds the cover 20 at an angle in this state.

Runout concave portions 27 in the shape of an arc along the convex portions 48 are formed on side ends of the hinge axis legs 23 so as to allow passage of the convex portions 48. When large force is applied to pivot the cover 20 from the state where the cover 20 is held by the frictional resistance and then the convex portions 48 reach the runout concave portions 27, the tips of the convex portions 48 fall into the runout concave portions 27 and then the frictional resistance to the hinge axis legs 23 is lost. The distance between the two C-shaped bearings 45 (the upper pawls 45A) is then returns from X2 (FIG. 18) to X1 (FIG. 17). In this state, the cover 20 is pivoted up to a larger angle than that causes hanging down due to its own weight, and accordingly tries to return to the original position when the frictional resistance is lost. However, the cover 20 does not return to the original position unless large force is intentionally applied to the cover 20 because the tips of the convex portions 48 contact the ends of the hinge axis legs 23 although the frictional resistance is lost. That is, the cover 20 is held in the attitude at this angle. The cover 20 then can be pivoted up to a position where the cover 20 is opened at 180 degrees by small force.

In this way, the presence of the runout concave portions 27 determines the angle at which the attitude of the cover 20 is held among the total angle of pivot of the cover 20. That is, the runout concave portions 27 are formed to adjust the angle at which the attitude of the cover 20 is held. The runout concave portions 27 can be increased or decreased in size, or can be formed on sides opposite to the positions shown in this embodiment as long as they are located on the orbits of the convex portions 48. The runout concave portions 27 can be eliminated if they are unnecessary.

The attitude holding structure according to the present embodiment includes two components, a component using the frictional resistance between the top surfaces of the convex portions 48 and the inner surfaces of the hinge axis legs 23, and a component using the contact between the tips of the convex portions 48 and the ends of the hinge axis legs 23, as described above. The attitude holding structure can include any one of these components or, of course, both of them.

The pair of C-shaped bearings according to the present embodiment includes the pair of upper pawls 45A that are formed with the predetermined distance spaced therebetween and curve forward from above, and the lower pawl 45B that is formed to be sandwiched between the two upper pawls 45A and project from below. The pair of C-shaped bearings can be two bearings that literally form C shapes. In this case, the convex portion forming a part of the attitude holding structure can be formed on any of two bifurcated tips of the C-shaped bearing. However, formation of the convex portions 48 on the upper pawls 45A located only on the upper side like in this embodiment can easily provide elasticity to the structure.

As described above, the terminal box according to the present embodiment includes as the attitude holding structure, the inner surfaces of the hinge axis legs 23 provided to the cover 20. Furthermore, the terminal box includes the convex portions 48 that are provided to the box body 40 to abut the inner surfaces of the hinge axis legs 23 when the cover 20 forms a predetermined angle with the box body 40. Both of them are arranged around the axis of the hinge structures 10. Therefore, the same effect as the conventional technique that the cable connecting operation can be achieved without detaching the cover 20 from the box body 40, and that the number of positioned to be screwed is reduced can be obtained. Further, the attitude of the cover 20 can be easily held in a position where the cover 20 does not become an obstacle to the operation. Accordingly, the workability is further enhanced.

Among the attitude holding structure, the convex portions can be provided to the cover 20, and the surfaces facing the convex portions can be provided to the box body 40. The surfaces facing the convex portions can be convex portions. That is, convex portions that press against each other when the cover 20 forms a predetermined angle with the box body 40 can be provided to the cover 20 and the box body 40, respectively.

The hinge structure 10 according to the present embodiment includes the hinge axis 25 that is provided on the cover 20 to act as the center of pivot of the cover 20; a pair of the hinge axis legs 23 that are provided from the cover 20 to support the both ends of the hinge axis 25; and the C-shaped bearings 45 that are provided on the box body 40 to cause the hinge axis 25 to pass through and to pivotally support the hinge axis 25. A part of the attitude holding structure is provided on the hinge axis legs 23, and the convex portions are provided on the C-shaped bearings 45, which faces the hinge axis legs 23. Therefore, the attitude holding structure can be easily obtained based on the hinge structure 10.

The bearing can be a bearing which does not have a bearing opening for attaching or detaching the hinge axis 25. The hinge axis can be provided on the box body 40, and the bearing can be provided on the cover 20. Further, among the attitude holding structure, the convex portion can be provided on the hinge axis leg 23, and the C-shaped bearing 45 can have the surface facing the convex portion.

Further, the terminal box according to the present embodiment further includes a pair of the upper pawls 45A with the predetermined distance spaced therebetween. The pair of the upper pawls 45A is positioned adjacent to each other on the inner sides of a pair of the hinge axis legs 23, respectively. The pair of the upper pawls 45A is pressed by the convex portions 48 that press the hinge axis legs 23 and is deformed to reduce the distance therebetween. Because the pair of the upper pawls 45A is pressed by substantially equal pressing force from both sides, a stable opening/closing operation can be achieved. Because the pair of the upper pawls 45A is elastically deformed, a convex structure can be easily obtained.

The pair of the upper pawls 45A has the convex portions 48 as the attitude holding structure that project from the upper pawls 45A to block pivot of the hinge axis legs 23 when the hinge axis 25 is pivotally supported by the bearings and pivoted to a position where it is within a predetermined angular range. The hinge axis legs 23 are latched by the convex portions 48 to hold the attitude of the cover 20. Moreover, the pair of the upper pawls 45A is elastically deformed to reduce the distance therebetween due to the pressing of the convex portions 48 by the hinge axis legs 23, and the attitude of the cover 20 is held by return force.

Furthermore, the knockout portions 49, which are broken and become the cable holes, are formed on the side opposite to the hinge structures 10 in the terminal box according to the present embodiment. Accordingly, even in a state where the cover 20 is held opened, the cover 20 does not interfere with the plus slots and the minus slots, and therefore do not produce negative effect on knockout.

Figure 19:
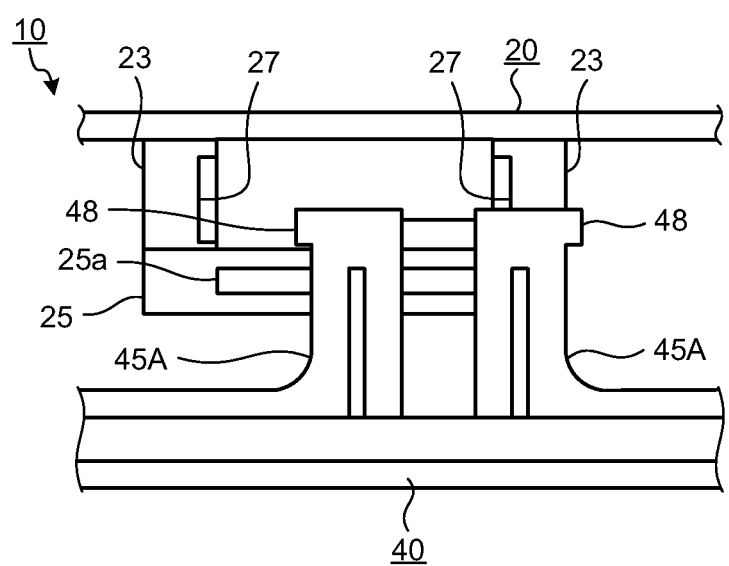
FIG. 19 is a top view of a hinge structure explaining another example of an attitude holding structure.
Figure 20:
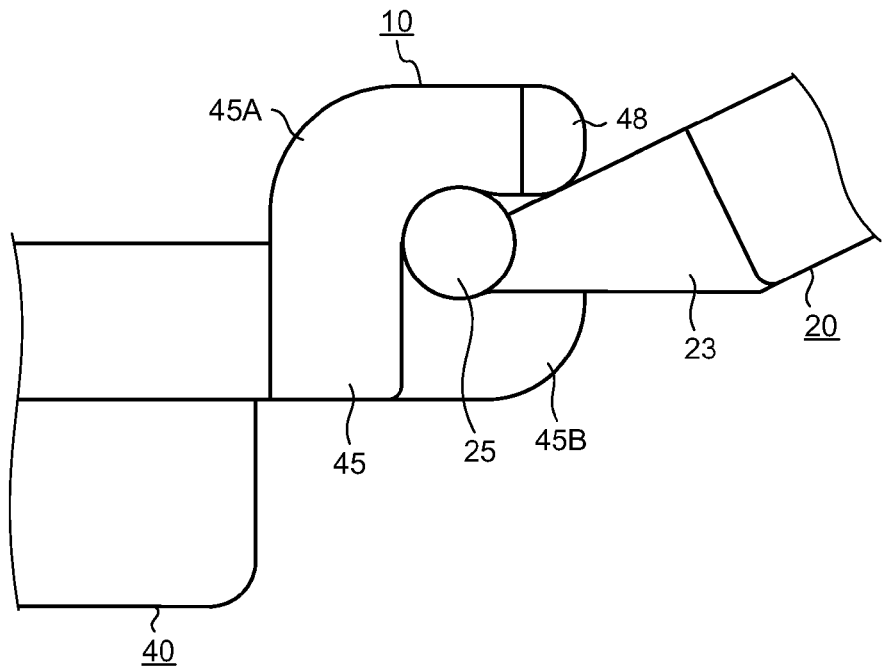
FIG. 20 is a partial side view of the hinge structure explaining another example of the attitude holding structure.

FIG. 19 is a top view of the hinge structure 10 for explaining another example of the attitude holding structure according to the present embodiment. FIG. 20 is a partial side view of the hinge structure 10 for explaining this example of the attitude holding structure according to the present embodiment. In this example, when the hinge axis legs 23 are positioned at the bearing openings of the C-shaped bearings 45 and slid in one direction of the hinge axis 25 (leftward in FIG. 19), the cover 20 can be detached or attached.

In the terminal box with this structure, when the hinge axis legs 23 that are in the process of being detached or attached are caught in the bearing openings of the C-shaped bearings 45, the hinge axis legs 23 are supported by the bearing openings of the C-shaped bearings 45. Thus, the cover 20 is held and therefore substantially the same operation can be performed as that in the above case where the frictional force of the convex portions is used.

Figure 21:
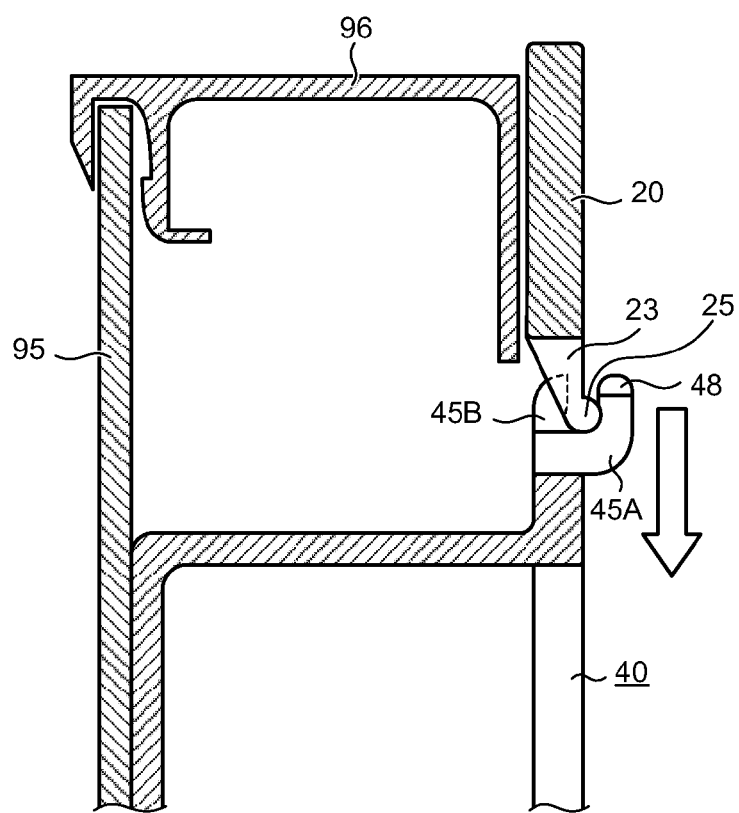
FIG. 21 is a cross-sectional view taken in a direction of arrows along a line B-B in FIG. 6, depicting a cross section of a solar cell module near a frame.

FIG. 21 is a cross-sectional view taken in a direction of arrows along a line B-B in FIG. 6, depicting a cross section of a solar cell module near the frame. In the C-shaped bearings 45 of the body-side hinge structure 41 according to the present embodiment, the bearing openings face in a direction along which the cover 20 is detached or attached by sliding in a direction parallel to the solar panel 95. That is, the C-shaped bearings 45 of the body-side hinge structure 41 have the bearing openings opened in a direction of a plane parallel to the bottom surface of the box body 40 (a plane parallel to the solar cell module).

With this configuration, when the cover 20 is to be attached to the box body 40, the cover 20 can be moved as shown by an outline arrow in FIG. 21 to be connected to the box body 40, which does not cause interference with the support frame 96. The C-shaped bearings 45 of the body-side hinge structure 41 can produce substantially the same effect by orienting the bearing openings at least toward the opposite side to the solar cell module (an opposite side to the solar panel).

Figure 22:
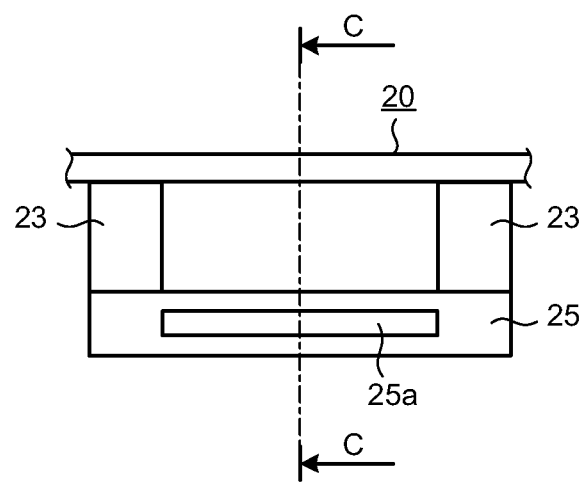
FIG. 22 is a top view of a cover-side hinge structure.
Figure 23:
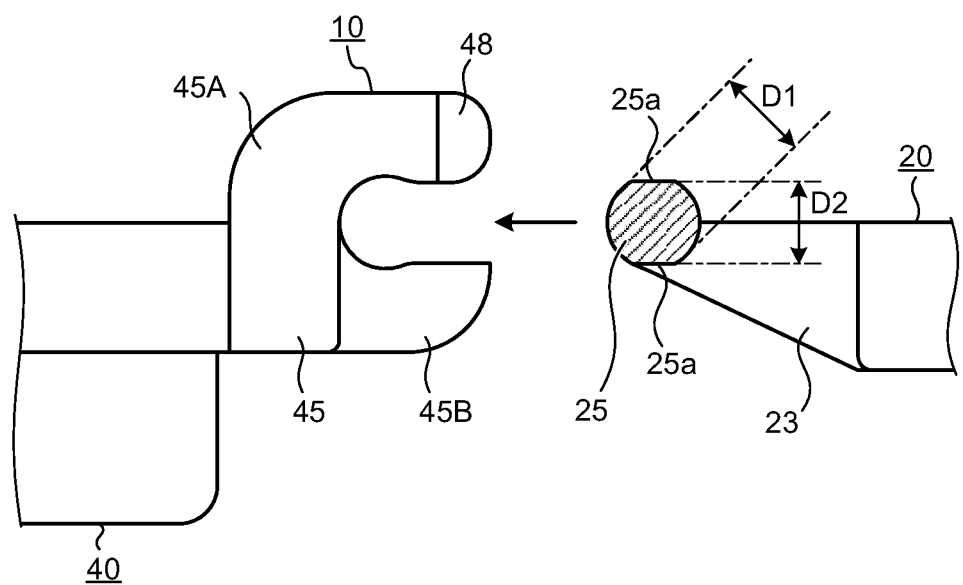
FIG. 23 is a partial sectional side view depicting a state of fitting the cover-side hinge structure to a body-side hinge structure, where the portion of the cover-side hinge structure is a cross-sectional view taken in a direction of arrows along a line C-C in FIG. 22.

FIG. 22 is a top view of the cover-side hinge structure according to the present embodiment. FIG. 23 is a partial sectional side view depicting a state of fitting the cover-side hinge structure to the body-side hinge structure. In the terminal box according to the present embodiment, the outer circumferential side surface of the total length of the hinge axis 25 is chipped in predetermined areas in an axial direction by a predetermined width and by a predetermined axial length to form the chipped portions 25a. The chipped portions 25a are formed on both circumferential side surfaces facing across the central axis. The portion to which the chipped portions 25a are formed has an axial diameter $D2$ slightly smaller than an original axial diameter $D1$.

The chipped portions 25a are formed to facilitate passage through the bearing openings of the C-shaped bearings 45 and are provided at least at positions where the hinge axis 25 passes through the bearing openings. The chipped portions 25a are assumed to have such a size that does not interfere with pivot of the hinge axis 25 within the bearings.

As described above, the shape of the inner circumferential surface of the C-shaped bearing 45 is made equal to the shape of the outer circumferential surface of the hinge axis 25 to fit the hinge axis 25 therein. The bearing opening is made slightly smaller than the diameter of the hinge axis 25 to prevent disengagement of the hinge axis 25.

In the terminal box with this configuration, the chipped portions 25a are formed at the positions facing across the central axis, and accordingly attachment or detachment of the hinge axis 25 to/from the C-shaped bearings 45 is facilitated. Because the chipped portions 25a are not formed in a larger size more than necessary, the axial diameter $D1$ effectively acts to prevent the pivot axis from decentering within the C-shaped bearings 45. Accordingly, no adverse effect is produced on the opening or closing operation for the cover 20.

The chipped portions 25a according to the present embodiment are formed on the two opposing outer circumferential surfaces, respectively. However, the predetermined effect can be obtained even when the chipped portion 25a is formed on any one of the surfaces. While the chipped portions 25a according to the present embodiment have flat surfaces, they can be formed in concave surfaces or slots.

INDUSTRIAL APPLICABILITY

As described above, the terminal box according to the present invention is useful as a terminal box for a solar cell module, and is particularly suitable for a terminal box that is installed on a rear surface of a solar cell module to form an output unit of the solar cell module.

The invention claimed is:
1. A terminal box for installing on a rear surface of a solar cell module and for outputting power generated by the solar cell module, the terminal box comprising:
   a box body having an opening on one surface, has a body-side hinge structure on an end thereof, and the box body for accommodating therein an output-cable connecting unit; and
   a cover that has a cover-side hinge structure forming a hinge with the body-side hinge structure, and that is pivotally supported by the hinge on an end thereof so as to pivotally open or close the opening of the box body, wherein one of the cover-side hinge structure and the body-side hinge structure has
- a hinge axis acting as a pivot center of the cover, and
- a pair of hinge axis legs that supports both ends of the hinge axis, the other of the cover-side hinge structure and the body-side hinge structure having
- a bearing that has a pair of first pawls, each having a first bearing surface and provided with a predetermined distance spaced therebetween, and a second pawl having a second bearing surface facing in a direction opposite to the bearing surfaces of the pair of first pawls, the bearing pivotally supporting the hinge axis by sandwiching the hinge axis between the bearing surfaces of the pair of first pawls and the second pawl,
- the pair of first pawls has outer side surfaces on outer sides of the respective first pawls,
- the pair of hinge axis legs has inner side surfaces, each of which faces with the outer side surface of a respective first pawl, on an inner side thereof, and
- the outer side surfaces of the pair of the first pawls and the inner side surfaces of the hinge axis legs are brought into contact with each other at opening and closing operation of the cover.

2. The terminal box according to claim 1, wherein the pair of first pawls has on the outer side surfaces convex portions that project outward in an axial direction from the first pawls and presses the inner side surfaces of the hinge axis legs at opening and closing operation of the cover.

3. The terminal box according to claim 2, wherein the pair of first pawls and the second pawl expose a bearing opening, to and from which the hinge axis is attached and detached, within a surface that includes the hinge axis and is parallel to the solar cell module.

4. The terminal box according to claim 2, wherein a plurality of the hinge structures is provided along a pivot axis of the cover, and in at least one of the hinge structures, the outer side surfaces of the pair of the first pawls and the inner side surfaces of the hinge axis legs are brought into contact with each other at opening and closing operation of the cover.

5. The terminal box according to claim 2, wherein the hinge axis legs have concave portions on the inner side surfaces thereof, and the concave portions are provided on movement paths of the convex portions to avoid contact with the convex portions at opening and closing operation of the cover.

6. The terminal box according to claim 5, wherein a part of an outer circumferential surface of the hinge axis is chipped in an axial direction.

7. A solar cell module that has a terminal box for outputting generated power on a rear surface thereof, wherein the terminal box comprises:
- a box body having an opening on one surface, has a body-side hinge structure on an end thereof, and the box body for accommodating therein an output-cable connecting unit; and
- a cover that has a cover-side hinge structure forming a hinge with the body-side hinge structure, and that is pivotally supported by the hinge on an end thereof so as to pivotally open or close the opening of the box body, and one of the cover-side hinge structure and the body-side hinge structure has
- a hinge axis acting as a pivot center of the cover, and
- a pair of hinge axis legs that supports both ends of the hinge axis, the other of the cover-side hinge structure and the body-side hinge structure having
- a bearing that has a pair of first pawls, each having a first bearing surface and provided with a predetermined distance spaced therebetween, and a second pawl having a second bearing surface facing in a direction opposite to the bearing surfaces of the pair of first pawls, the bearing pivotally supporting the hinge axis by sandwiching the hinge axis between the bearing surfaces of the pair of first pawls and the second pawl,
- the pair of first pawls has outer side surfaces on outer sides of the respective first pawls,
- the pair of hinge axis legs has inner side surfaces, each of which faces with the outer side surface of a respective first pawl, on an inner side thereof, and
- the outer side surfaces of the pair of the first pawls and the inner side surfaces of the hinge axis legs are brought into contact with each other at opening and closing operation of the cover.

8. The terminal box according to claim 1, wherein the box body has a knockout portion formed on a side plate opposite to a side plate on which the hinge structure is formed, to be broken and become a cable hole.

* * * * *